(12) United States Patent
Brown et al.

(10) Patent No.: US 8,738,977 B2
(45) Date of Patent: May 27, 2014

(54) YIELD-ENHANCING DEVICE FAILURE ANALYSIS

(75) Inventors: David A. Brown, Austin, TX (US);
James Thomas Kirk, Austin, TX (US);
David P. Sonnier, Austin, TX (US);
Chris R. Stone, Austin, TX (US)

(73) Assignee: Agere Systems LLC, Allentown, PA (US)

( * ) Notice: Subject to any disclaimer, the term of this patent is extended or adjusted under 35 U.S.C. 154(b) by 0 days.

(21) Appl. No.: 11/468,838

(22) Filed: Aug. 31, 2006

(65) Prior Publication Data

US 2008/0072118 A1 Mar. 20, 2008

(51) Int. Cl.
*G11C 29/00* (2006.01)

(52) U.S. Cl.
USPC .......................... 714/723; 714/704

(58) Field of Classification Search
USPC ............... 714/704, 723, 718, 738, 766–768
See application file for complete search history.

(56) References Cited

U.S. PATENT DOCUMENTS

| 5,233,614 A * | 8/1993 | Singh .............................. 714/723 |
| 6,029,260 A * | 2/2000 | Hashizume et al. ........... 714/723 |
| 6,157,558 A * | 12/2000 | Wong .......................... 365/49.11 |
| 6,339,546 B1 * | 1/2002 | Katayama et al. ........ 365/185.09 |
| 6,535,993 B1 * | 3/2003 | Hamada et al. .................... 714/6 |
| 6,574,757 B1 * | 6/2003 | Park et al. ...................... 714/710 |
| 6,859,904 B2 * | 2/2005 | Kocol et al. .................... 714/764 |

* cited by examiner

*Primary Examiner* — Steve Nguyen
(74) *Attorney, Agent, or Firm* — Ryan, Mason & Lewis, LLP

(57) ABSTRACT

In a system including a processor and memory coupled to the processor, a method of device failure analysis includes the steps of: upon each error detected within a test series performed on a device, the processor storing within a table in the memory an address at which the error occurred in the device and storing a bit position of each failed bit corresponding to that address; for each unique address at which at least one error occurred, determining how many different bit positions corresponding to the address failed during the test series; and based on results of the test series, determining whether the device failed the test series.

22 Claims, 6 Drawing Sheets

YIELD-ENHANCING DEVICE FAILURE ANALYSIS

FIELD OF THE INVENTION

The present invention relates generally to techniques for electronic device testing, and more particularly relates to techniques for enhancing the yield of manufacturing such devices by means of improved failure analysis.

BACKGROUND OF THE INVENTION

As part of the manufacturing process, a device is tested by applying one or more test patterns (called a test series) to it and noting any unexpected results (errors). In cases where devices fail these tests by generating one or more errors and are not immediately discarded thereafter, these devices are then analyzed in a post-processing environment. That is, the device is put back on a tester and subjected to further testing, usually consisting of stepping through the original pattern sequence one pattern at a time until the error is replicated and then extracting internal status information from the chip for additional post-processing. This time-consuming and expensive process would be repeated until each failed pattern was separately replicated, extracted, and analyzed.

Additionally, devices often include error correction circuitry (ECC) to improve reliability of these devices. Although single-bit error correction is the most common such technique, wherein any one erroneous bit within the contents of a given address can be corrected, multiple-bit correction, wherein two or more erroneous bits within the contents of a given address can be corrected, may also be used. When devices with error correction circuitry are subjected to normal pattern testing, no allowances are made to account for the error correction features. Therefore, if the device fails a single test (i.e., if there is a single erroneous bit within the contents of a given address), the device is marked as failed.

Accordingly, there exists a need for improved failure analysis techniques which do not suffer from one or more of the above-described problems associated with conventional failure analysis.

SUMMARY OF THE INVENTION

The present invention, in illustrative embodiments thereof, comprises more efficient methods and apparatus for device failure analysis. For devices which include error correction circuitry therein, illustrative embodiments of the invention provide a means of increasing manufacturing yield by taking into account the error correction capabilities of a given device under test in determining whether or not the device passes a test series performed on the device.

In accordance with one aspect of the invention, in a system including a processor and memory coupled to the processor, a method of device failure analysis includes the steps of: upon each error detected within a test series performed on a device, the processor storing within a table in the memory an address at which the error occurred in the device and storing a bit position of each failed bit corresponding to that address; for each unique address at which at least one error occurred, determining how many different bit positions corresponding to the address failed during the test series; and based on results of the test series, determining whether the device failed the test series. This aspect would permit real-time, rather than post-test, analysis of failure conditions.

Determining whether the device failed the test series may include determining whether the total number of errors detected exceeds a threshold of allowable errors, which may be less than or equal to the maximum number of entries of the table and/or whether, for any address at which an error occurred, the number of fail bit positions exceeds a number of allowable errors per address. This feature permits the testing process to advantageously increase manufacturing yield by taking into account error correction in determining whether a device is capable of functioning correctly. In an illustrative embodiment of the invention, the table may include an associative array implemented using content-addressable memory, wherein each entry of the table represents an address in the device at which an error occurred and includes the failed bit positions corresponding to that address.

In accordance with another aspect of the invention, apparatus for performing failure analysis on a device includes memory and at least one processor coupled to the memory. The memory includes at least one table. The processor is operative: upon each error detected within a test series performed on a device, to store within the at least one table an address at which the error occurred in the device and to store a bit position of each failed bit corresponding to that address; for each unique address at which at least one error occurred, to determine how many different bit positions corresponding to the address failed during the test series; and based on results of the test series, to determine whether the device failed the test series. Embodiments of the invention may be implemented as an integrated circuit device.

In accordance with yet another aspect of the invention, a method is provided for increasing the yield of integrated circuit devices including respective error correction circuitry therein, the error correction circuitry in each device being configured to correct a prescribed number of bit errors in the device. The method includes the steps of: collecting test information based at least in part on a test series performed on the integrated circuit device; determining an amount of bit errors in the integrated circuit device based at least in part on the test information; and indicating the integrated circuit device as a failing device when the amount of bit errors exceeds the prescribed number of bit errors and indicating the integrated circuit device as a passing device when the amount of bit errors is less than or equal to the prescribed number of bit errors.

These and other features and advantages of the present invention will become apparent from the following detailed description of illustrative embodiments thereof, which is to read in connection with the accompanying drawings.

DETAILED DESCRIPTION OF THE INVENTION

The present invention will be described herein in the context of exemplary methods and apparatus for improving failure analysis of electronic circuit devices including memory so as to increase a manufacturing yield of functioning devices. It is to be understood, however, that the techniques of the present invention are not limited to the methods and apparatus shown and described herein.

A "device" as the term is used herein may comprise, by way of example and without limitation, elements such as those commonly associated with an application-specific integrated circuit (ASIC), single inline memory module (SIMM), dual inline memory module (DIMM), content-addressable memory (CAM), central processing unit (CPU), digital signal processor (DSP), or any other type of data processing or storage device, as well as portions and/or combinations of such elements.

Although illustrated herein as comprising CAM, the invention does not require the use of CAM. Rather, techniques of illustrative embodiments of the invention may be implemented using other types of hardware (e.g., microprocessors or other devices), or even using software (e.g., an associative array or a vector), or using a combination of hardware and software, as will become apparent to those skilled in the art.

Figure 1:
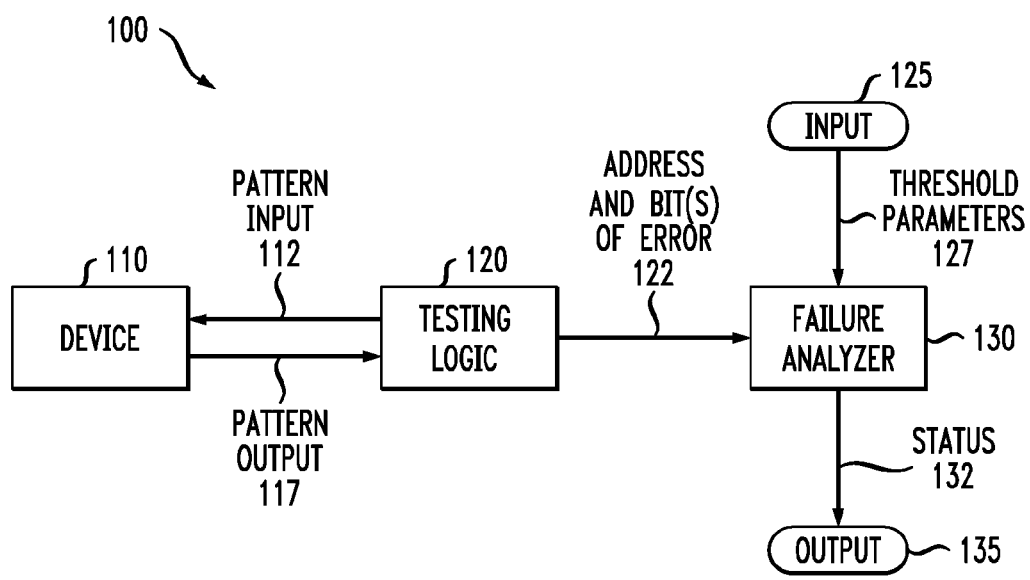
FIG. 1 is a simplified block diagram of an exemplary testing system in which techniques of the present invention are implemented, in accordance with an embodiment of the invention.

FIG. 1 is a block diagram depicting at least a portion of an exemplary device testing system 100 in which techniques of the invention are implemented, in accordance with an embodiment of the invention. The system 100 includes a device under test (DUT) 110 which may be functionally tested by using a series of pattern inputs 112. The pattern inputs 112 can be generated by testing logic 120, as is conventionally done, in such a manner as to cause the device 110, when functioning in accordance with acceptable operational limits, to produce predictable outputs in response to the respective pattern inputs. The testing logic 120, in turn, compares a pattern output 117 generated by the device 110 in response to each pattern input 112 with an expected output and, if any portion of the output does not match, preferably outputs the address 122 at which the detected error occurred and the bit(s) affected.

The system 100 further includes a failure analyzer 130 configured to analyze information regarding the detected error, in light of prescribed threshold parameters 127 (e.g., a maximum allowable number of errors, a maximum allowable number of bit-errors per address, etc.) supplied from an input 125, which may, for instance, comprise a user, a data file, another program, etc., and will determine status information 132 relating to the device (e.g., whether the device should be considered as having passed or failed the test series). The status information 132 generated by the failure analyzer 130 may be sent to an output, which may, for instance, comprise a user, a data file, another program, a storage device, etc. The status information 132 may be presented for display (e.g., on a monitor) to a user.

The portion of the exemplary system 100 shown in FIG. 1 is considerably simplified for clarity of illustration. It should also be understood, however, that the particular arrangements of system elements shown in the figures and described herein are by way of illustrative example only. More specifically, as previously noted, the invention can be implemented in any of a number of forms, and is not limited to any particular device-testing application.

Figure 2:
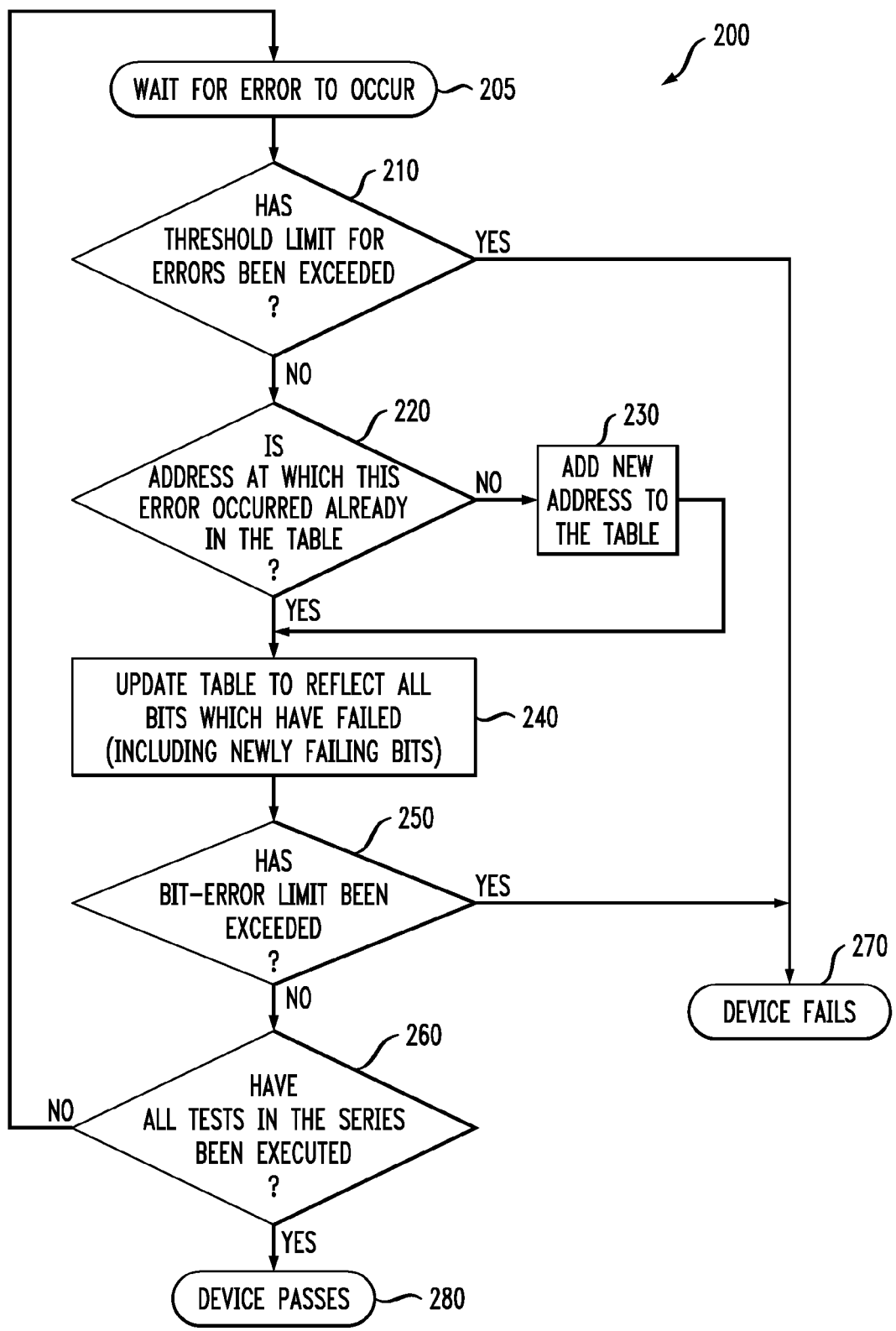
FIG. 2 is a flow diagram illustrating an exemplary testing method, in accordance with an embodiment of the invention.

FIG. 2 is a logical flow diagram showing an illustrative method 200 which may be used to implement failure analyzer 130 shown in FIG. 1, in accordance with an embodiment of the invention. The method 200 begins in step 205, wherein the method preferably waits for an error to be detected. Upon receipt of an error (e.g., address 122 of detected error, as depicted in FIG. 1), method 200 preferably determines whether or not the maximum number of errors (e.g., in threshold parameters 127 in FIG. 1) has been exceeded in step 210. This threshold limit should be less than or equal to the maximum number of entries in the table so as to prevent table overflow conditions. If the maximum number of errors has been exceeded, the device (e.g., device 110 in FIG. 1) fails this test series in step 270 and appropriate status output is generated (e.g., status information 132 in FIG. 1). If the maximum number of errors has not been exceeded, the method 200 checks to see if the address at which this error occurred is already present in the table in step 220 and, if the address of the detected error is not present in the table, adds the new address to the table in step 230. For some embodiments (e.g., using CAM or some alternative implementation of an associative array), steps 220 and 230 may be combined into a single step. In other embodiments, additional steps may be combined into a single step, such as, for example, steps 220, 230 and 240.

In step 240, the table entry representing the address of a detected error is preferably updated to reflect all bits which have failed, including the bits which have failed the most recent test. This may be done, for instance, by accumulating failed bit positions in the table for each unique address at which an error occurred during the test series. By way of example, if within a given address, a bit failed a previous test and a different bit corresponding to that address fails a more recent test, this address entry should be updated to reflect failures of both bits, which should be counted as if both failed the same test for purposes of determining that this is a multibit error rather than a single-bit error. This can be done, for example, by logically ORing the contents of the table corresponding to that address, although the invention contemplates other techniques for accumulating the total number of bit errors for a given address.

Next, in step 250, the method 200 determines whether or not a limit on the maximum allowable bit-errors per address (e.g., part of threshold parameters 127 in FIG. 1) has been exceeded for this address. This limit is preferably set to be equal to the number of bit-errors capable of being corrected by means of error-correction circuitry which may be used with the device for each address. For example, if there is no error-correction implemented, the limit on the maximum allowable bit errors per address should be zero. If the device is used with single-bit error-correction capability, the limit on the maximum allowable bit errors per address should be one. If there is double-bit error-correction, this limit should be two, and so on. If the limit on the maximum allowable bit errors per address has been exceeded, the device fails this test series in step 270 and an appropriate output is generated. If the limit on the maximum allowable bit errors per address has not been exceeded, the method 200 then checks to see if all tests in the series have been executed in step 260. If all tests have been executed, then the device has passed the test series and an appropriate output is generated in step 280. If not, the method 200 returns to step 205 where it waits for a next error to occur.

Figure 3:
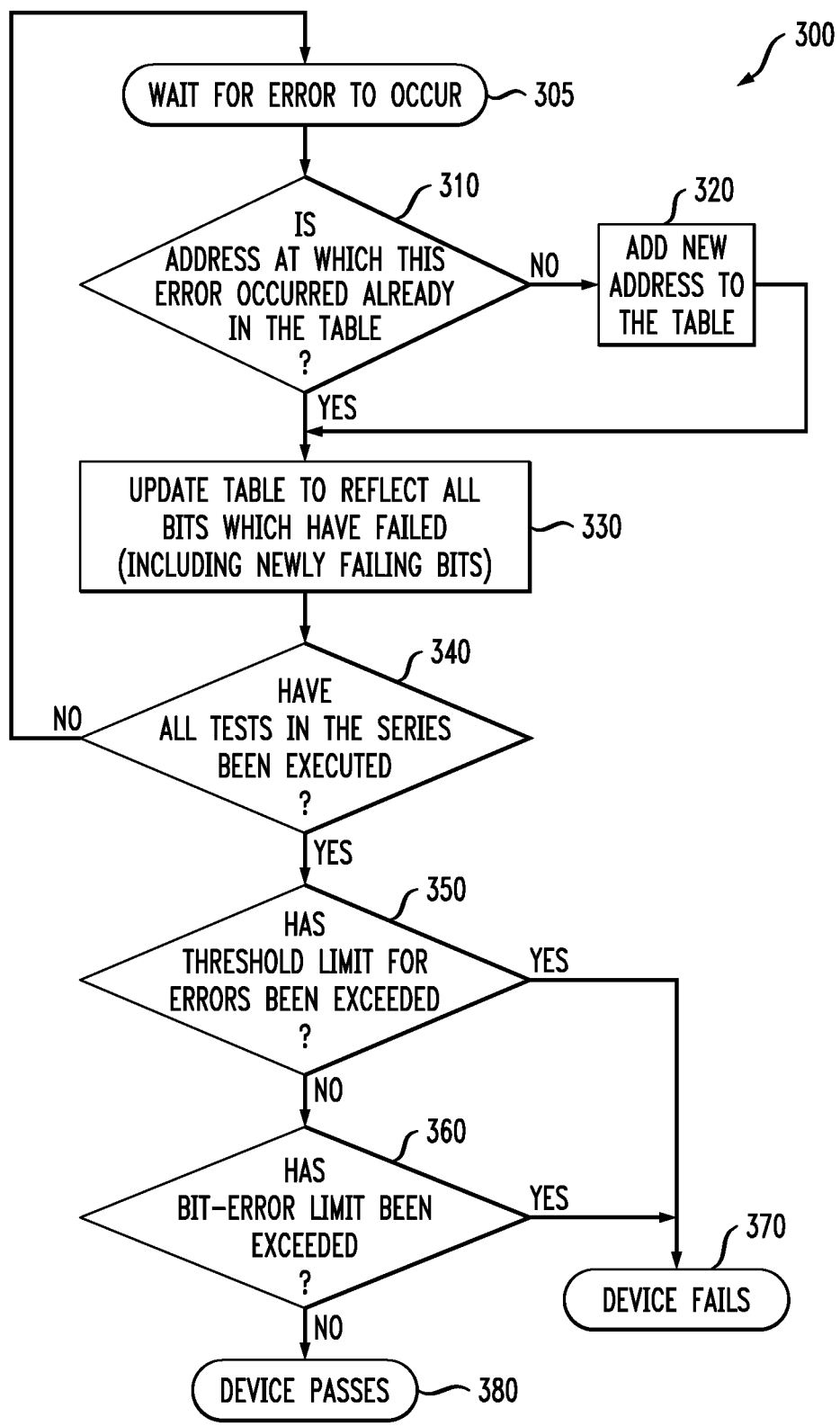
FIG. 3 is a flow diagram illustrating an exemplary testing method, in accordance with another embodiment of the invention.

FIG. 3 is a logical flow diagram depicting an illustrative method 300 which may be used to implement failure analyzer 130 shown in FIG. 1, in accordance with another embodiment of the invention. The method 200 shown in FIG. 2 is, perhaps, more efficient than method 300 depicted in FIG. 3, at least in terms of processing time, but does not ensure that the test series is completed. Rather, method 200 aborts testing as soon as the device is determined to have failed the test series. The method 300 shown in FIG. 3, by contrast, will run through all tests in the series before determining whether the device passes or fails, and thereby ensures that the test series is completed. Each step in method 300 shown in FIG. 3 is preferably identical to a corresponding step in method 200 of FIG. 2, although such steps need not be the same. Preferably, only the order in which the steps are performed in method 300 has been somewhat changed compared to method 200 shown in FIG. 2.

Specifically, method 300 begins in step 305, wherein the method preferably waits for an error to be detected. Upon detection of an error, method 300 preferably checks to see if the address at which this error occurred is already present in the table in step 310 and, if the address of the detected error is not present in the table, the new address is added to the table in step 320. For some embodiments (e.g., using CAM or some alternative implementation of an associative array), steps 310 and 320 may be combined into a single step. In other embodiments, additional steps may be combined into a single step, such as, for example, steps 310, 320 and 330. If the address of the detected error is already present in the table, process flow continues at step 330, wherein the table entry representing the address of the detected error is preferably updated to reflect all bits which have failed, including the bits which have failed the most recent test. This can be done, for example, by accumulating failed bit positions in the table for each unique address at which an error occurred during the test series.

Next, in step 340, method 300 checks to see whether or not all tests in the series have been executed. If all tests have been executed, then method 300 continues to step 350. If not, method 300 returns to step 305 where it waits for a next error to occur. In step 350, the method determines whether or not the maximum number of errors (e.g., as defined by threshold parameters 127 in FIG. 1) has been exceeded. This threshold limit should be less than or equal to the maximum number of entries in the table so as to prevent table overflow from occurring. If the maximum number of errors has been exceeded, the device fails this test series in step 370 and an appropriate status output is generated (e.g., status information 132 in FIG. 1). If the maximum number of errors has not been exceeded, method 300 then proceeds to step 360 which determines whether or not a limit on maximum allowable bit-errors per address (e.g., part of threshold parameters 127 in FIG. 1) has been exceeded for any valid address in the table. This limit is preferably set to be equal to the number of bit-errors capable of being corrected by means of error-correction circuitry which may be included in the device for each address. For example, if there is no error-correction implemented in the device, the limit on the maximum allowable bit errors per address should be zero. If the device includes single-bit error-correction capability, either incorporated within the device itself or coupled to error correction circuitry external to the device, the limit on the maximum allowable bit errors per address should be one. If there is double-bit error-correction, this limit should be two, and so on.

If the limit on the maximum allowable bit errors per address has been exceeded, the device fails this test series in step 370 and an appropriate output is generated. If the limit on the maximum allowable bit errors per address has not been exceeded, then the device has passed the test series and an appropriate output is generated in step 380.

The above-described embodiments of the invention are intended to be illustrative only. For example, other configurations or modifications of the steps shown in FIG. 2 and FIG. 3 are possible. Likewise, although the illustrative embodiment of FIG. 1 shows the threshold parameters being inputted into the table, it is possible to have them hard-coded into the table. Other embodiments can use different types and arrangements of processing elements for implementing the described functionality. These and numerous other alternative embodiments within the scope of the following claims will be apparent to those skilled in the art.

Figure 4:
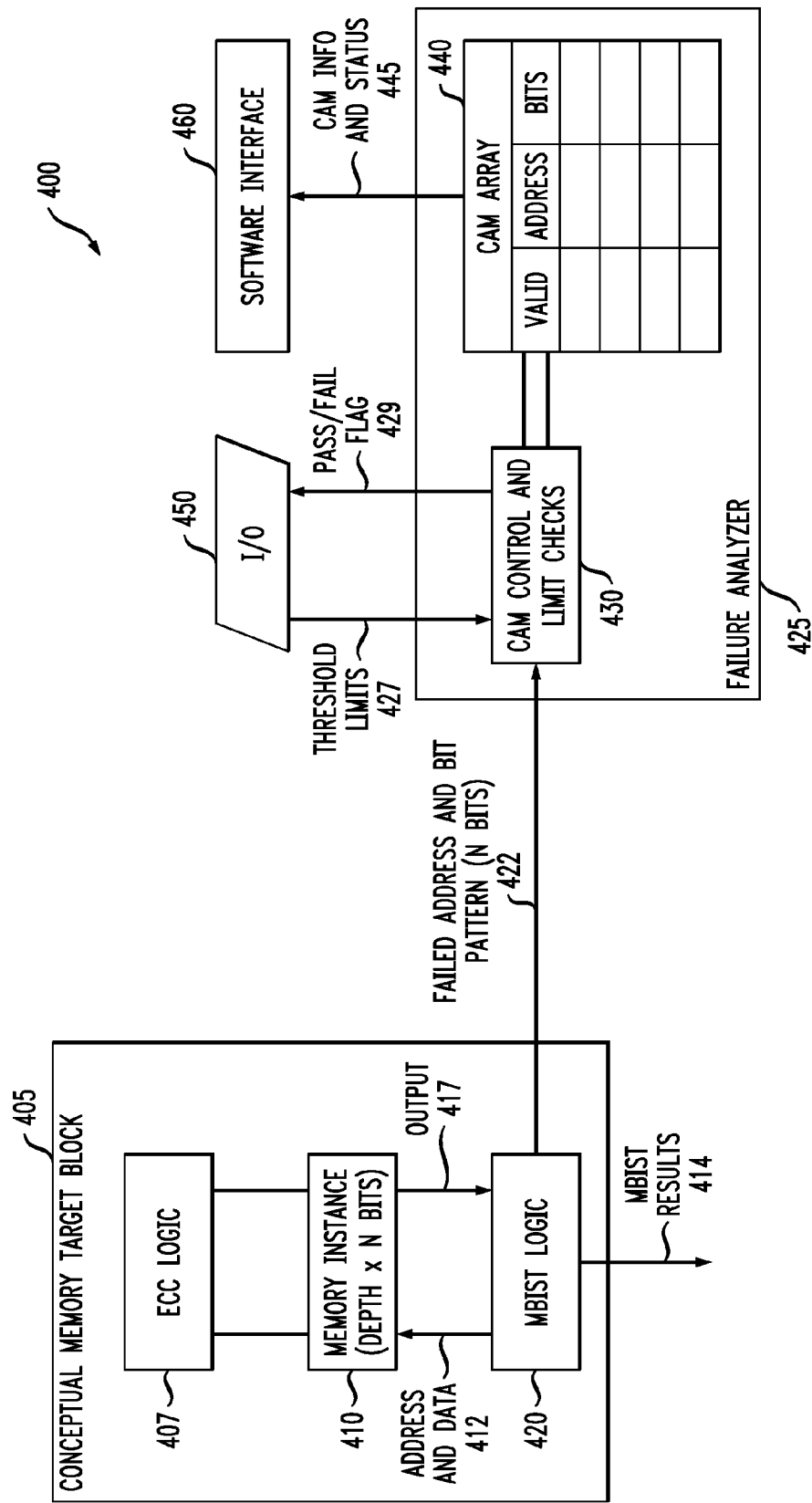
FIG. 4 is a simplified block diagram of an exemplary testing system in which techniques of the present invention are implemented, in accordance with an embodiment of the invention.
Figure 5:
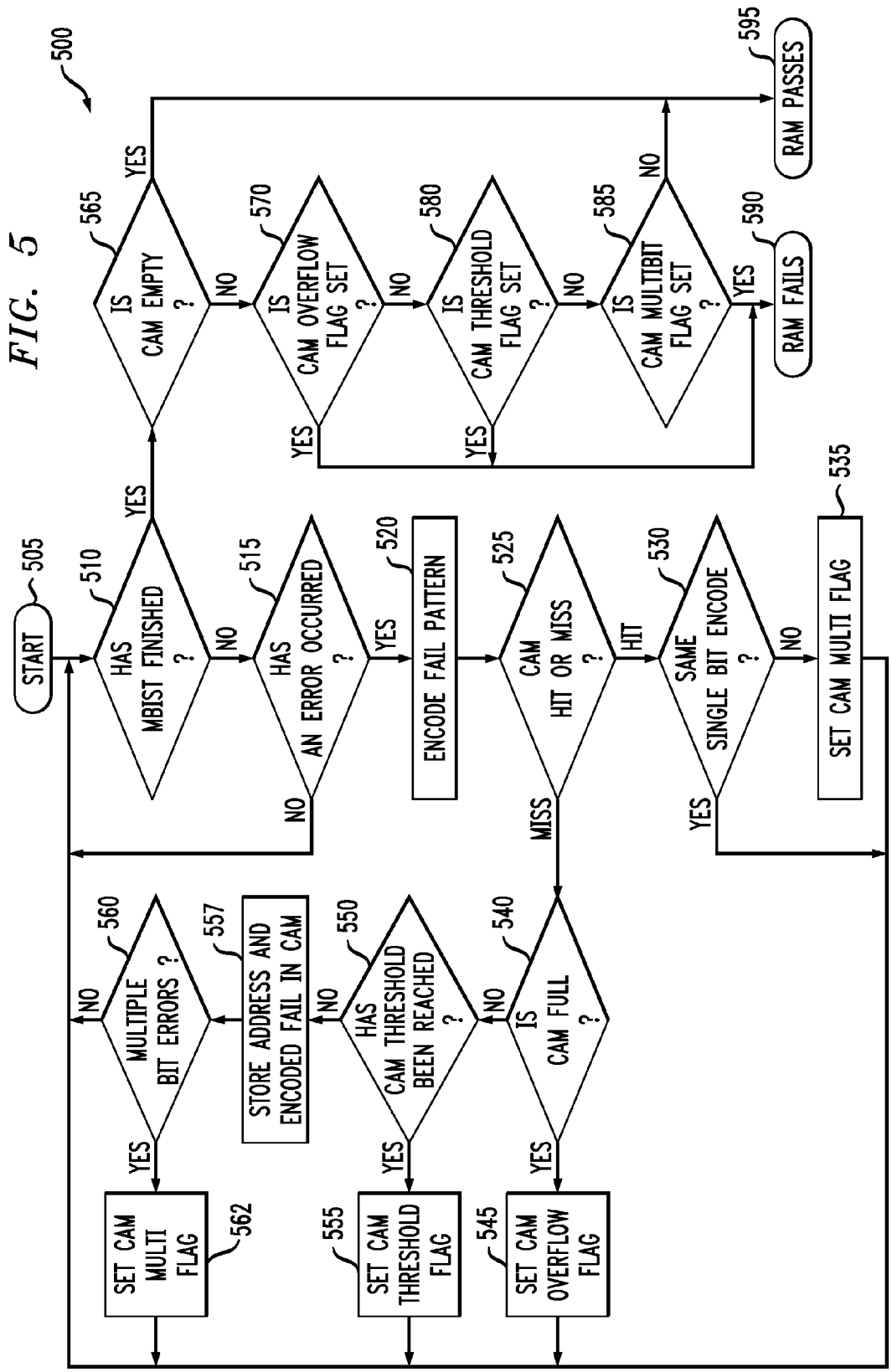
FIG. 5 is a flow diagram illustrating an exemplary testing method, in accordance with another embodiment of the invention.

FIGS. 4 and 5 illustrate various aspects of an exemplary embodiment of the invention. In this illustrative embodiment, the device being tested is a memory device (e.g., random access memory (RAM)) with integrated single-bit error correction. Additionally, the testing logic is preferably implemented in the form of a memory built-in self-test (MBIST), which is integrated into the device itself. Furthermore, the table in the failure analyzer is preferably implemented using CAM.

With reference now to FIG. 4, there is shown a block diagram depicting at least a portion of an exemplary device testing system 400 in which techniques of the invention are implemented, in accordance with an embodiment of the invention. The device to be tested is a conceptual memory target block 405, which comprises memory 410 (e.g., an M×N bit array, where M and N are integers), ECC logic 407, and MBIST logic 420. The ECC logic 407 in this instance implements single-bit error correction for the data stored within the memory 410. The memory 410 is functionally tested by using a series of pattern inputs 412, comprising a series of parameters (e.g., addresses and data), which are generated by MBIST logic 420 in such a manner as to cause the memory 410, when functioning in accordance with acceptable operational limits, to produce predictable outputs in response to the respective pattern inputs. The MBIST logic 420, in turn, receives a pattern output 417 generated by the memory 410 in response to each pattern input 412 with an expected output and, if any portion of the output does not match, outputs the address 422 at which the detected error occurred and preferably the bit(s) affected. In addition, the MBIST logic 420 will issue results of the test 414 (e.g., a conclusion regarding whether the device to be tested passed or not). Because the results 414 generated by the MBIST logic 420 fail to account for the error correction provided by the ECC logic 407, they will include false positives in the sense that devices which have errors which would otherwise be rendered inconsequential by the ECC logic 407 therein (e.g., single bit errors which are correctable) will be rejected.

The system 400 further includes a failure analyzer 425 configured to analyze information regarding the detected error. The failure analyzer 425 in this embodiment preferably comprises an array implemented using CAM array 440, and control logic 430 coupled to the CAM array, whose functions include CAM control and limit checking. The CAM array 440 comprises a series of entries, each entry having a bit to indicate the validity of that entry, an address, and a list of bits within that address. The address may be used as a key and the bits as the value.

The control logic 430 analyzes information regarding the detected errors, in light of prescribed threshold limits 427 (e.g., comprising a maximum allowable number of errors) supplied from an input 450, which may, for instance, comprise a user, a data file, another program, a storage device, etc., in order to generate a result 429 which may be in the form of pass/fail flag, or alternative indication, relating to the device (e.g., whether the device should be considered as having passed or failed the test series). This result 429 generated by the failure analyzer 425, specifically its control logic 430, replaces the output 414 generated by the MBIST logic 420. This result 429 may be sent to an input/output (I/O) device 450, which may, for instance, comprise a user, a data file, another program, a storage device, etc., or it may be presented for display (e.g., on a monitor) to a user. Additionally, the CAM contents and status 445 may be optionally exported to a software interface 460 for further analysis if desired.

The portion of the exemplary system 400 shown in FIG. 4 is considerably simplified for clarity of illustration. It should also be understood, however, that the particular arrangements of system elements shown in the figures and described herein are by way of illustrative example only. More specifically, as previously noted, the invention can be implemented in any of a number of forms, and is not limited to any particular device-testing application.

FIG. 5 is a logical flow diagram showing an illustrative method 500 which may be used to implement failure analyzer 425 shown in FIG. 4, in accordance with an embodiment of the invention. The method 500 begins in step 505, which usually coincides with the receipt of a start or reset signal. In step 505, the CAM flags (discussed below) are cleared, the CAM (e.g. CAM array 440 in FIG. 4) is cleared (made empty), and the threshold limit 427 in FIG. 4 is read from input 450 in FIG. 4. In step 510, the method checks to see if the MBIST has finished (e.g., if all tests have been completed). If it has not, the method continues to step 515, in which it determines whether an error has occurred (e.g., the address and bit pattern of the error 422 in FIG. 4). If no error has occurred, the process loops back to step 510 and resumes waiting either for the MBIST to finish (step 510) or for an error to occur (step 515).

If an error does occur, the method attempts to enter the error into the CAM in step 520 by using the address of the detected error as a key and the bitmask as a value. As shown in step 525, either the address will already be in the CAM, in which case a CAM hit will occur, or the address will not be in the CAM, in which case a CAM miss will occur. If there is a CAM hit (which would mean there was a previous error at this address), the method checks to see whether the current bit is already encoded in the CAM (i.e., whether the same bit was involved in the previous error) in step 530. If the bit was not already encoded, a CAM Multi flag, or alternative indicator, is set in step 535 to indicate the presence of a multiple-bit error, and the method returns to step 510. If the bit was already encoded, the method returns to step 510 without setting the CAM Multi flag.

If, on the other hand, a CAM miss is detected in step 525, the method then checks to see whether the CAM is full in step 540. If the CAM is full, the method will set a CAM Overflow flag, or alternative indicator, in step 545 and then loop back to step 510. If the CAM is not full, the method will see whether a CAM Threshold has been reached in step 550. If so, a CAM Threshold flag will be set in step 555 and the method will loop back to step 510. Otherwise, the address and encoded fail pattern are stored in the CAM in step 557 and then the encoded fail pattern is evaluated to determine whether or not there are multiple bit errors in step 560. The encoded fail pattern represents the failing bit of the address that failed, in the case of a single bit error, or specifies the occurrence of multiple bit errors, in the case of multiple errors at that address. If there are not multiple bit errors at that address (i.e., a single bit error case), the method loops back to step 510. If there are multiple bit errors at that address, the CAM Multi flag is set in step 562, to indicate the presence of multiple bit errors at that address, and the method then loops back to step 510.

When the MBIST has finished, the method will move from step 510 to step 565, in which it tests to see if the CAM is empty. If the CAM is empty (i.e., no errors occurred during testing), the RAM passes and an appropriate flag, or alternative indicator, is output in step 595 (e.g., Pass/Fail flag 429 in FIG. 4). Otherwise, the method then checks to see if the CAM Overflow flag is set in step 570; if it is, the RAM fails and an appropriate flag, or alternative indicator, is output in step 590 (e.g., Pass/Fail flag 429 in FIG. 4). If the CAM Overflow flag is not set, the method then checks to see if the CAM Threshold flag is set in step 580; if it is, the RAM fails and an appropriate indicator (e.g., flag) is output (step 590). Otherwise, the method then checks to see if the CAM Multibit flag is set in step 585; if it is, the RAM fails and an appropriate indicator is output (step 590). If the CAM Multibit flag is not set, the RAM passes and an appropriate indicator (e.g., flag) is output (step 595).

Figure 6:
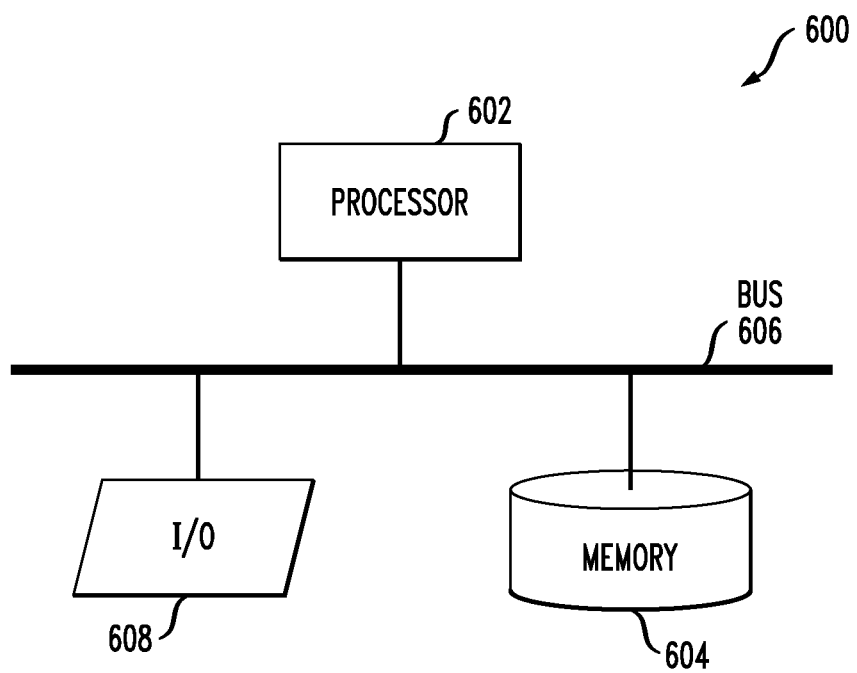
FIG. 6 is a simplified block diagram depicting an exemplary processing system in which techniques of the present invention may be implemented, in accordance with an embodiment of the invention.

The testing methodologies of embodiments of the invention may be particularly well-suited for implementation in an electronic device or alternative system. For example, FIG. 6 is a block diagram depicting an exemplary processing system 600 formed in accordance with an aspect of the invention. System 600 may include a processor 602, memory 604 coupled to the processor (e.g., via a bus 606 or alternative connection means), as well as input/output (I/O) circuitry 608 operative to interface with the processor. The processor 602 may be configured to perform at least a portion of the methodologies of the present invention, illustrative embodiments of which are shown in FIGS. 2, 3, and 5 and described herein above.

It is to be appreciated that the term "processor" as used herein is intended to include any processing device, such as, for example, one that includes a central processing unit (CPU) and/or other processing circuitry (e.g., network processor, DSP, microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, one or more output devices (e.g., printer, monitor, etc.) for presenting the results associated with the processor, and/or interface circuitry for operatively coupling the input or output device(s) to the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 602. In any case, it is to be appreciated that at least a portion of the components shown in FIGS. 1 and 4 may be implemented in various forms of hardware, software, or combinations thereof, e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the components of the invention.

At least a portion of the methodologies of the present invention may be implemented in integrated circuit automated test equipment (ATE) for performing device verification and/or characterization. Manufacturers of such ATE include, but are not limited to, Teradyne Inc., Testmetrix Inc., MOSAID Technologies Inc., ALLTEQ Industries Inc., Schlumberger Ltd., Advantest Corp., and in TEST Corp.

At least a portion of the apparatus and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. In a system including a processor and memory coupled to the processor, a method of device failure analysis, the method comprising the steps of:
    performing a plurality of tests on a device;
    detecting a first error at a given address of the device in a first one of the plurality of tests, the first error being associated with a first set of bit positions corresponding to the given address;
    storing in a table a first entry for the given address, the first entry identifying the first set of bit positions;
    detecting a second error at the given address of the device in a second one of the plurality of tests, the second error being associated with a second set of bit positions corresponding to the given address;
    storing in the table a second entry for the given address, the second entry identifying the second set of bit positions;
    determining whether the second set of bit positions comprises any bit positions which are not in the first set of bit positions;
    responsive to determining that at least one bit position in the second set of bit positions is not in the first set of bit positions, modifying the first entry in the table to identify a third set of bit positions, the third set of bit positions comprising the first set of bit positions and the at least one bit position in the second set of bit positions which is not in the first set of bit positions; and
    determining that the device fails the plurality of tests if a number of bit positions in the third set of bit positions exceeds an error correction capability of error correction circuitry associated with the device;
    wherein modifying the first entry in the table comprises applying one or more logical functions to the first entry and the second entry.

2. The method of claim 1, wherein each entry of the table corresponds to a unique address in the device at which at least one error occurred during the plurality of tests.

3. The method of claim 1, wherein the table comprises an associative array.

4. The method of claim 1, wherein the table is implemented using content-addressable memory.

5. The method of claim 1, further comprising the step of:
    declaring the device to have failed the plurality of tests when the number of errors detected within the plurality of tests exceeds a threshold of allowable errors.

6. The method of claim 5, wherein the threshold of allowable errors is less than or equal to a maximum number of entries in the table.

7. The method of claim 1, wherein the device comprises a built-in self-test and the plurality of tests is implemented in the built-in self-test.

8. The method of claim 1, further comprising the step of recording a HIT in the table on detecting the second error at the given address.

9. The method of claim 1, further comprising the step of recording a MISS in the table when the given address at which the first error occurred in the device does not match an address previously stored in the table.

10. The method of claim 1, further comprising the step of indicating a presence of an OVERFLOW condition in the table when the given address at which the first error occurred in the device does not match an address previously stored in the table and the table is full.

11. The method of claim 10, further comprising the step of indicating that the device is a failing device when an OVERFLOW condition in the table exists.

12. The method of claim 1, wherein the error correction circuitry comprises single-bit error correction circuitry and the error correction capability is one.

13. The method of claim 1, wherein the error correction circuitry comprises double-bit error correction circuitry and the error correction capability is two.

14. The method of claim 1 wherein applying the one or more logical functions comprises logically ORing the first entry and the second entry.

15. The method of claim 1 wherein the plurality of tests comprises a test series.

16. Apparatus for performing failure analysis on a device, the apparatus comprising:
    memory including at least one table;
    at least one processor coupled to the memory, the processor operative:
        to perform a plurality of tests on the device;
        to detect a first error at a given address of the device in a first one of the plurality of tests, the first error being associated with a first set of bit positions corresponding to the given address;
        to store in the at least one table a first entry for the given address, the first entry identifying the first set of bit positions;
        to detect a second error at the given address of the device in a second one of the plurality of tests, the second error being associated with a second set of bit positions corresponding to the given address;
        to store in the at least one table a second entry for the given address, the second entry identifying the second set of bit positions;
        to determine whether the second set of bit positions comprises any bit positions which are not in the first set of bit positions;
        responsive to determining that at least one bit position in the second set of bit positions is not in the first set of bit positions, to modify the first entry in the at least one table to identify a third set of bit positions, the third set of bit positions comprising the first set of bit positions and the at least one bit position in the second set of bit positions which is not in the first set of bit positions; and to determine that the device fails the plurality of tests if a number of bit positions in the third set of bit positions exceeds an error correction capability of error correction circuitry associated with the device;

wherein the processor is operative to modify the first entry in the at least one table by applying one or more logical functions to the first entry and the second entry.

17. The apparatus of claim 16, wherein the at least one processor is operative to declare the device to have failed the plurality of tests when a number of errors detected within the plurality of tests exceeds a threshold of allowable errors.

18. The apparatus of claim 17, wherein the threshold of allowable errors is less than or equal to a maximum number of entries of the at least one table.

19. The apparatus of claim 16, wherein the apparatus is implemented as an integrated circuit.

20. A method of increasing manufacturing yield of integrated circuit devices, each integrated circuit device including respective error correction circuitry therein, the method comprising the steps of:

collecting test information based at least in part on a plurality of tests performed on the integrated circuit device storing the test information in a table, a first entry in the table for a given address identifying a first set of bit positions corresponding to a first error detected during a first one of the plurality of tests and a second entry in the table for the given address identifying a second set of bit positions corresponding to a second error detected during a second one of the plurality of tests;

determining an amount of different bit positions corresponding to the given address in the integrated circuit device based at least in part on the test information, the amount of different bit positions corresponding to the given address comprising the first set of bit positions and at least one bit position in the second set of bit positions not in the first set of bit positions; and determining that the integrated circuit device fails the plurality of tests if the amount of different bit positions corresponding to the given address exceeds an error correction capability of error correction circuitry associated with the device;

wherein determining the amount of different bit positions corresponding to the given address comprises applying one or more logical functions to the first entry and the second entry.

21. An article of manufacture for performing device failure analysis, comprising a non-transitory machine-readable storage medium for use in accordance with a processor, the medium containing one or more programs which when executed implement the steps of:

performing a plurality of tests on a device;

detecting a first error at a given address of the device in a first one of the plurality of tests, the first error being associated with a first set of bit positions corresponding to the given address;

storing in a table a first entry for the given address, the first entry identifying the first set of bit positions;

detecting a second error at the given address of the device in a second one of the plurality of tests, the second error being associated with a second set of bit positions corresponding to the given address;

storing in the table a second entry for the given address, the second entry identifying the second set of bit positions;

determining whether the second set of bit positions comprises any bit positions which are not in the first set of bit positions;

responsive to determining that at least one bit position in the second set of bit positions is not in the first set of bit positions, modifying the first entry in the table to identify a third set of bit positions, the third set of bit positions comprising the first set of bit positions and the at least one bit position in the second set of bit positions which is not in the first set of bit positions; and determining that the device fails the plurality of tests if a number of bit positions in the third set of bit positions exceeds an error correction capability of error correction circuitry associated with the device;

wherein modifying the first entry in the table comprises applying one or more logical functions to the first entry and the second entry.

22. An integrated circuit test apparatus, the test apparatus comprising:

memory including at least one table;

at least one processor coupled to the memory, the processor operative:

to perform a plurality of tests on the device;

to detect a first error at a given address of the device in a first one of the plurality of tests, the first error being associated with a first set of bit positions corresponding to the given address;

to store in the at least one table a first entry for the given address, the first entry identifying the first set of bit positions;

to detect a second error at the given address of the device in a second one of the plurality of tests, the second error being associated with a second set of bit positions corresponding to the given address;

to store in the at least one table a second entry for the given address, the second entry identifying the second set of bit positions;

to determine whether the second set of bit positions comprises any bit positions which are not in the first set of bit positions;

responsive to determining that at least one bit position in the second set of bit positions is not in the first set of bit positions, to modify the first entry in the at least one table to identify a third set of bit positions, the third set of bit positions comprising the first set of bit positions and the at least one bit position in the second set of bit positions which is not in the first set of bit positions; and to determine that the device fails the plurality of tests if a number of bit positions in the third set of bit positions exceeds an error correction capability of error correction circuitry associated with the device;

wherein the processor is operative to modify the first entry in the at least one table by applying one or more logical functions to the first entry and the second entry.

* * * * *